United States Patent [19]

Kominami et al.

[11] 4,041,409
[45] Aug. 9, 1977

[54] AUTOMATIC GAIN CONTROL CIRCUIT

[75] Inventors: Yasuo Kominami, Kokubunji; Yukio Suzuki, Hirai Hinode; Masami Kawamura, Kodaira, all of Japan

[73] Assignee: Hitachi, Ltd., Japan

[21] Appl. No.: 729,984

[22] Filed: Oct. 6, 1976

[30] Foreign Application Priority Data

Oct. 8, 1975  Japan .............................. 50-120673

[51] Int. Cl.² ............................................. H03G 3/30
[52] U.S. Cl. .................................... 330/29; 330/30 D
[58] Field of Search ..................... 330/29, 30 D, 69; 358/27

[56] References Cited

U.S. PATENT DOCUMENTS 3,838,210   9/1974   Peil ................................... 330/29 X Primary Examiner—James B. Mullins
Attorney, Agent, or Firm—Craig & Antonelli

[57] ABSTRACT

A radio-frequency automatic gain control circuit wherein at the time of a weak field input, the input signal is amplified by a differential amplifier, and at the time of an intense field input, the differential amplifier is operated as a grounded-emitter amplifier.

9 Claims, 5 Drawing Figures

AUTOMATIC GAIN CONTROL CIRCUIT

BACKGROUND OF THE INVENTION

FIELD OF THE INVENTION

This invention relates in general to an amplifier circuit for radio frequency signals, and more particularly to an amplifier circuit which is capable of automatic gain control (hereinbelow abbreviated to "AGC") by a control signal responsive to the magnitude of the radio frequency signal.

DESCRIPTION OF THE PRIOR ART

Figure 1:
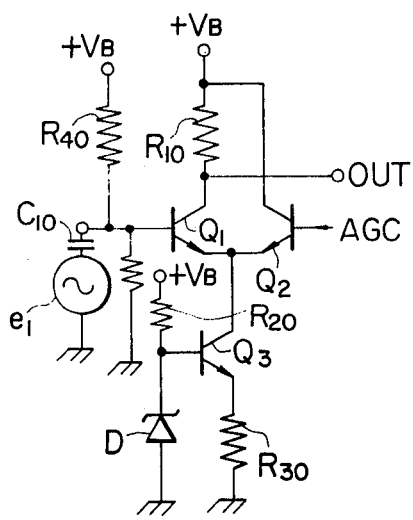
FIGS. 1 and 2 are circuit diagrams each showing a prior art AGC amplifier circuit.

FIG. 1 shows a prior art RFAGC (radio frequency AGC) circuit employing a differential amplifier. Transistors $Q_1$ and $Q_2$ are connected with resistors $R_{10}$ and $R_{40}$ in the standard differential amplifier configuration. An input signal from source $e_1$ is supplied to the base of transistor $Q_1$ through capacitor $C_{10}$, while an AGC voltage is supplied to the base of the other transistor $Q_2$. A transistor $Q_3$ connected to a resistance $R_{30}$ forms a constant current circuit having its base biased by a constant voltage element D connected in series with a resistance $R_{20}$ to a voltage source $+V_B$, so that a constant d.c. current normally flows between the collector and emitter of the transistor $Q_3$.

When the input signal from source $e_1$ becomes intense, the output signal of the transistor $Q_1$ increases. Since, however, the AGC voltage also increases, the bias current of the transistor $Q_1$ changes to decrease the mutual conductance $g_m$, and the increase of the output signal of the transistor $Q_1$ is suppressed. On the other hand, when the input signal becomes weak, the output signal of the transistor $Q_1$ decreases. Since, however, the AGC voltage decreases also, the bias current of the transistor $Q_1$ changes to increase the mutual conductance $g_m$, and the decrease of the output signal of the transistor $Q_1$ is suppressed. For a medium signal condition, neither the AGC voltage nor the mutual conductance of the transistor $Q_1$ changes, and the output signal is not controlled. In this way, automatic gain control is effected.

Figure 2:
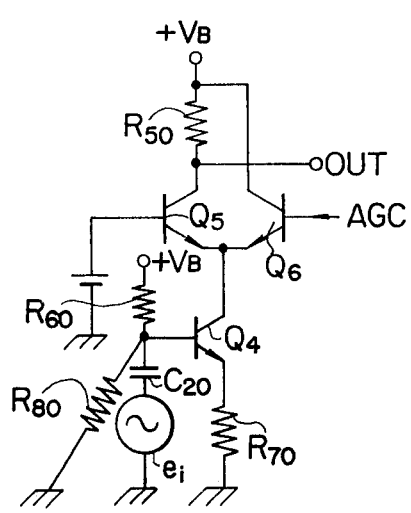

FIG. 2 shows a prior art RFAGC circuit employing a grounded-emitter amplifier. In the FIGURE, $Q_4$ designates a transistor, the emitter of which is connected to a resistor $R_{70}$ and the base of which is supplied with an input signal from source $e_1$ through a capacitor $C_{20}$ and is connected to a voltage divider formed by resistances $R_{60}$ and $R_{80}$. A transistor $Q_5$ is connected in cascade to the transistor $Q_4$, having its collector connected to voltage source $+V_B$ through resistor $R_{50}$ while its base is supplied with a.d.c. bias supply voltage. A transistor $Q_6$ has its emitter commonly connected with the emitter of the transistor $Q_5$, and its base is supplied with an AGC voltage.

When the input signal becomes intense in this circuit, the collector signal of the transistor $Q_4$ increases, and also the output signal of the transistor $Q_5$ increases. Since, however, the AGC voltage simultaneously increases to increase the bias current of the transistor $Q_6$, the bias current of the transistor $Q_5$ changes to decrease the mutual conductance $g_m$ thereof, and the increase of the output signal is suppressed. On the other hand, when the input signal becomes weak, the collector current of the transistor $Q_4$ decreases, and also the output signal of the transistor $Q_5$ decreases. Since, however, the AGC voltage simultaneously decreases to decrease the bias current of the transistor $Q_6$, the bias current of the transistor $Q_5$ changes to increase the mutual conductance $g_m$ thereof, and the decrease of the output signal is suppressed. In this manner, automatic gain control is effected.

With the prior art circuit in FIG. 1, the mutual conductance $g_m$ is great, and hence, the practical sensitivity or the signal-to-noise ratio for a weak signal input is good. However, the dynamic range in which the circuit can respond to the input signals is narrow, and the distortion at an ultra-intense input increases. With the prior art circuit in FIG. 2, although the input dynamic range is wide, the mutual conductance $g_m$ is small. The practical sensitivity for a weak signal input is therefore inferior, so that the signal-to-noise ratio is inferior.

SUMMARY OF THE INVENTION

This invention has eliminated the various disadvantages described above, and has for its objects to provide a gain-controlled amplifier circuit with which the practical sensitivity for an input signal at a weak electric field is enhanced, and besides, the distortion of an input signal at an intense electric field is reduced.

Another object of this invention is to provide a gain-controlled amplifier circuit of wide dynamic range which is suited to be constructed as an integrated semiconductor circuit.

According to the present invention, a combination of the advantageous features of the prior art differential amplifier and grounded-emitter amplifier circuits is attained in a circuit which operates as a differential amplifier circuit to provide AGC during weak input signal conditions and operates as a grounded-emitter amplifier circuit to provide AGC during intense input signal conditions. Such a circuit includes first and second pairs of transistors connected in differential amplifier configuration and being coupled in cascade, and means for supplying a gain control signal to either transistor in each pair of transistors so as to increase the collector bias current of one of the first pair of transistors and conversely decrease the collector bias current of one of said second pair of transistors in response to an increase in an input signal applied to said first pair of transistors.

PREFERRED EMBODIMENTS OF THE INVENTION

Figure 3:
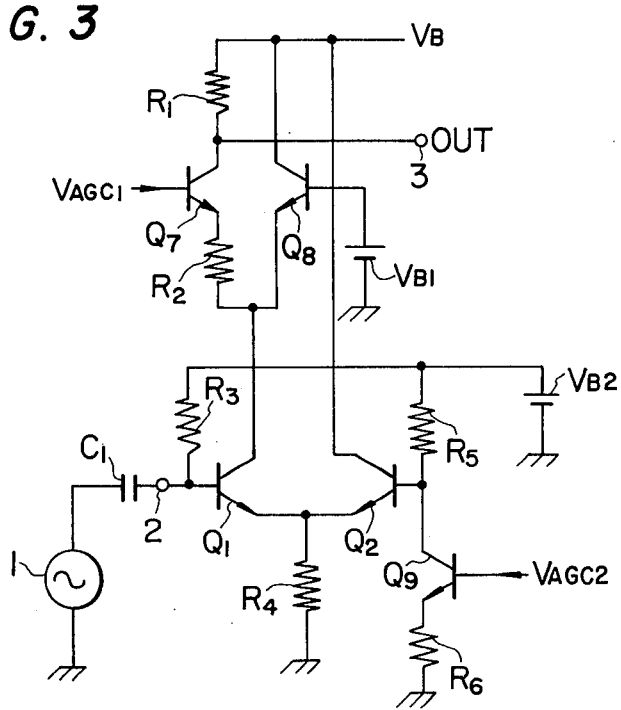
FIG. 3 is a circuit diagram of a first embodiment of the AGC amplifier circuit according to this invention.

FIG. 3 is a circuit diagram of an embodiment of the gaincontrolled amplifier circuit according to this invention. The circuit is put into the form of an integrated semiconductor circuit within a single silicon semiconductor substrate. Referring to FIG. 3, numeral 1 designates an RF input signal source, one end of which is grounded and the other end of which is connected through a capacitor $C_1$ to an input terminal 2 of the chip of the integrated semiconductor circuit. The input terminal 2 is connected to the base of an N-P-N transistor $Q_1$. A bias supply voltage $V_{B2}$ is supplied to the base of transistor $Q_1$ through a resistance $R_3$, while the emitter thereof is grounded through a resistance $R_4$ and the collector is connected to an emitter resistance $R_2$ of an N-P-N transistor $Q_7$. The base of the transistor $Q_7$ is supplied with an AGC voltage $V_{AGC1}$ derived from a transistor $Q_{10}$ shown in FIG. 5. The collector of the transistor $Q_7$ is connected to an output terminal 3, and is also connected to a source of supply voltage $V_B$ through a resistance $R_1$.

An N-P-N transistor $Q_8$ has its emitter connected to the emitter of the transistor $Q_7$ so as to form a first differential amplifier together with the transistor $Q_7$, has its base connected to a source of supply voltage $V_{B1}$, and has its collector connected to the source of supply voltage $V_B$. An N-P-N transistor $Q_2$ has its emitter connected to the emitter of the transistor $Q_1$ so as to form a second differential amplifier together with the transistor $Q_1$. The transistor $Q_2$ has its base connected to the source of bias supply voltage $V_{B2}$ through a resistance $R_5$, and has its collector connected to the source of supply voltage $V_B$. A transistor $Q_9$ is an N-P-N transistor, the emitter of which is grounded through a resistance $R_6$ and the collector of which is connected to the base of the transistor $Q_2$. The base of the transistor $Q_9$ is supplied with an AGC voltage $V_{AGC2}$ from transistor $Q_{21}$ shown in FIG. 5.

The operation of the circuit of FIG. 3 will now be described. For a weak field input, the AGC voltage $V_{AGC2}$ applied to the base of the transistor $Q_9$ is very small. Accordingly, the transistor $Q_9$ is "off" and the transistor $Q_2$ is biased by the d.c. supply voltage $V_{B2}$. Therefore, the transistors $Q_1$ and $Q_2$ operate as a differential amplifier. That is, the RF input signal 1 applied to the input terminal 2 is amplifier by the second differential amplifier and is thereafter taken out as an output signal OUT from the output terminal 3 via the transistor $Q_7$ which is connected in cascade to the amplifier. At this time, since the control voltage applied to the base of the transistor $Q_7$ is great, the transistor $Q_7$ is saturated, but the transistor $Q_8$ is cut off. Here, since a differential amplifier is used, a high mutual conductance $g_m$ is obtained, and the practical sensitivity is high. By way of example, a value of 46 dB/m is attained which is extraordinarily high as an amplifier circuit for RF signals. In consequence, the signal-to-noise ratio is good.

For a medium field intensity, when the input signal becomes great, also the AGC voltage $A_{AGC2}$ becomes great, and the transistor $Q_2$ tends toward cut-off. Then, the gain of the transistor $Q_1$ decreases due to the increase of the collector current thereof. Accordingly, the AGC action is effected by the transistor $Q_2$. At this time, since the control voltage $V_{AGC1}$ applied to the base of the transistor $Q_7$ is great, the transistor $Q_7$ is saturated, but the transistor $Q_8$ is cut off.

For an ultra-intense input, the AGC voltage $V_{AGC2}$ applied to the base of the transistor $Q_9$ is great. Accordingly, the transistor $Q_9$ turns "on" and the transistor $Q_2$ turns "off" and does not exert on AGC action on the transistor $Q_1$. Consequently, the transistor $Q_1$ operates as a grounded-emitter amplifier. That is, the RF signal applied to the input terminal 2 is amplified by the groundedemitter amplifier and is thereafter taken out from the output terminal 3 via the transistor $Q_7$ which is connected in cascade to the amplifier. At this time, the transistors $Q_7$ and $Q_8$ operate in the active regions. The transistor $Q_7$ operates as a grounded-base amplifier for the RF signal, and it effects AGC action by the ACG voltage $V_{AGC1}$ conjointly with the transistor $Q_8$ connected in the differential form. At this time, since the transistor $Q_1$ is used as a grounded-emitter amplifier, the dynamic range can be made wide, and the distortion can be reduced. The distortion factor becomes below 1% at field intensities of below 126 dB/m.

In this manner, according to the present invention, AGC is perfomed in conjunction with a differential amplifier circuit for an input signal during a weak electric field and it is performed in conjunction with a cascade connection type amplifier circuit consisting of a grounded-emitter amplifier circuit and a grounded-base amplifier circuit for an input signal during an intense electric field.

Figure 4:
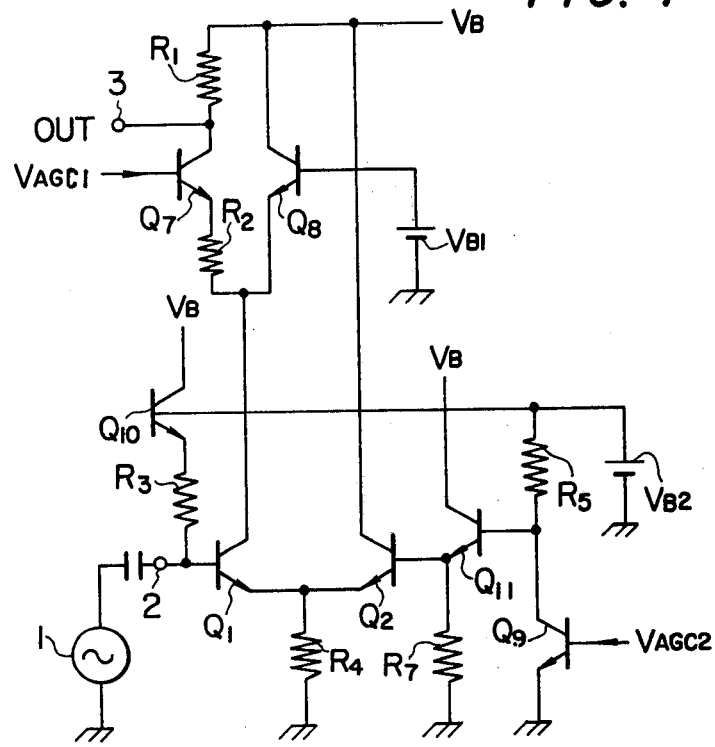
FIG. 4 is a circuit diagram of a second embodiment of the present invention.

FIG. 4 shows a second embodiment of an RFAGC circuit in accordance with this invention. In the FIGURE, the same parts as in FIG. 3 are assigned the same symbols, and the explanation thereof is omitted. In the present embodiment, the d.c. supply voltage $V_{B2}$ is applied to the base of the transistor $Q_1$ through a transistor $Q_{10}$ of the emitter follower type and the resistance $R_3$, and also to the base of the transistor $Q_2$ through the resistance $R_5$ and a transistor $Q_{11}$ of the emitter follower type. Accordingly, the output impedance of the bias power source is low, noises are reduced, and the bias is stabilized.

This invention is greatly effective when applied especially to an AM tuner.

Figure 5:
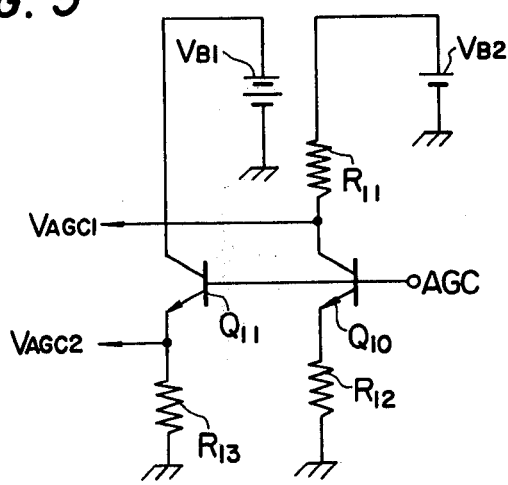

The circuit of FIG. 5 is a level transformation circuit which provides the AGC signals $V_{AGC1}$ and $V_{AGC2}$. Each of the transistors $Q_{10}$ and $Q_{11}$ is controlled by the AGC signal applied to the base thereof. The transistor $Q_{10}$ has its emitter connected to resistance $R_{12}$ and its collector connected through resistance $R_{11}$ to voltage source $V_{B2}$. The transistor $Q_{11}$ has its emitter connected to resistance $R_{11}$ and its collector connected directly to voltage source $V_{B1}$. AS a result of this circuit, the AGC signals $V_{AGC1}$ and $V_{AGC2}$ will be of opposite phase, but the levels thereof will be substantially the same.

As set forth above, according to the automatic gain control circuit of this invention, for a weak field input, the input radio frequency signal is amplified by a predetermined differential amplifier, so that the mutual conductance $g_m$ can be made great. The AGC circuit accordingly has the advantage that the practical sensitivity for the weak field input can be enhanced. For an ultra-intense input, the differential amplifier is operated as a grounded-emitter amplifier, so that the dynamic range can be made wide. The AGC circuit, accordingly, has the advantage that the distortion can be reduced. Furthermore, since the circuit of this invention is a directly-coupled circuit consisting of the differential pair of transistors and the resistances, it can be readily put into the form of an IC within a single silicon semiconductor substrate by the integrated semiconductor circuit technology.

While we have shown and described several embodiments in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

What is claimed is:

1. An automatic gain control circuit comprising:
    a first pair of transistors whose emitters are commonly coupled to one end of common impedance means, the other end of said common impedance means being connected to a reference potential source;

a second pair of transistors whose emitters are commonly coupled to a collector of one of said first pair of transistors, the collector of the other of said first pair of transistors being connected to a source of operating potential;

load impedance means for coupling the collector of one of said second pair of transistors to said source of operating potential, the collector of the other of said second pair of transistors being directly connected to said source of operating potential;

means for applying an input signal to said one of said first pair of transistors; and means for supplying a gain control signal to the base of either transistor in each pair of said first pair of transistors and said second pair of transistors so as to increase the collector bias current of said one of said first pair of transistors and conversely decrease the collector bias current of said one of said second pair of transistors in response to an increase of said input signal.

2. The circuit according to claim 1, wherein said means for supplying said gain control signal is coupled to the base of said other of said first pair of transistors and to the base of said one of said second pair of transistors.

3. The circuit according to claim 2, wherein said means for supplying said gain control signal includes the collector-emitter path of a fifth transistor which is connected between said base of said other of said first pair of transistors and said reference potential source, and a resistance which is connected between said base of said other of said first pair of transistors and a first bias potential source, the base of said fifth transistor receiving said gain control signal.

4. The circuit according to claim 3, further including a level transformation circuit means for coupling the base of said fifth transistor and the base of said one of said second pair of transistors to said gain control signal.

5. The circuit according to claim 4, wherein said level transformation circuit is composed of an emitter follower type transistor amplifier and a grounded emitter type transistor amplifier, and said gain control signal is applied commonly to the bases of the two transistor amplifiers.

6. A gain-controlled amplifier circuit comprising:

a first differential pair of transistors whose emitters are commonly coupled in a differential amplifier configuration;

a second differential pair of transistors whose emitters are commonly coupled to a collector of one of said first differential pair of transistors;

means for supplying an input signal to the base of said one of said first differential pair of transistors;

means for deriving an output signal from a collector of one of said second differential pair of transistors;

means for applying a gain control signal to a base of either transistor in said first differential pair of transistors so as to change the collector bias currents of said first differential pair of transistors in response to an input signal level when the level of said input signal does not exceed a predetermined first value, whereby automatic gain control is achieved by said first differential pair of transistors at the input signal levels not exceeding said predetermined first value; and means for applying said gain control signal to the base of either transistor in said second differential pair of transistors so as to change the collector bias currents of said second differential pair of transistors in response to an input signal level when the level of said input signal exceeds said predetermined first value, whereby automatic gain control is achieved by said second differential pair of transistors at the input signal levels exceeding said predetermined first value.

7. A gain-controlled amplifier circuit according to claim 6, wherein said gain control signal is applied to the base of the other transistor of said first differential pair of transistors and to the base of said one transistor of said second differential pair of transistors with opposite phases.

8. A gain-controlled amplifier circuit according to claim 7, wherein said gain control signal is provided by a level transformation circuit means comprising an emitter follower type transistor amplifier and a grounded-emitter type transistor amplifier, a general gain control signal being applied commonly to the bases of the two transistor amplifiers.

9. A gain-controlled amplifier circuit according to claim 7, further including a fifth transistor connected between the base of said other transistor of said first differential pair of transistors and reference potential source, and a resistance connected between the base to which said fifth transistor is connected and a bias potential source, the base of said fifth transistor receiving said gain control signal.

* * * * *